United States Patent [19]

Dearnaley et al.

[11] 3,830,668

[45] Aug. 20, 1974

[54] FORMATION OF ELECTRICALLY INSULATING LAYERS IN SEMI-CONDUCTING MATERIALS

[75] Inventors: Geoffrey Dearnaley, Abingdon; Richard Stuart Nelson, Goring-on-Thames, both of England

[73] Assignee: United Kingdom Atomic Energy Authority, London, England

[22] Filed: July 19, 1971

[21] Appl. No.: 163,713

[52] U.S. Cl. .................................. 148/1.5, 317/235
[51] Int. Cl. .............................................. H01l 7/54
[58] Field of Search ...................................... 148/1.5

[56] References Cited

UNITED STATES PATENTS

| | | | |
|---|---|---|---|
| 3,457,632 | 7/1969 | Dolan et al. | 148/1.5 |
| 3,515,956 | 6/1970 | Martin et al. | 148/1.5 |
| 3,586,542 | 6/1971 | MacRae | 148/1.5 |
| 3,622,382 | 11/1971 | Brack | 148/1.5 |
| 3,663,308 | 5/1972 | Davey | 148/1.5 |
| 3,666,548 | 5/1972 | Brack et al. | 148/1.5 |
| 3,707,765 | 1/1973 | Coleman | 148/1.5 |

OTHER PUBLICATIONS

Solid-State Electronics, Pergamon Press 1969, Vol. 12, pp. 209-214.

*Primary Examiner*—L. Dewayne Rutledge
*Assistant Examiner*—J. M. Davis
*Attorney, Agent, or Firm*—Larson, Taylor & Hinds

[57] ABSTRACT

A method of forming an insulating layer within a semiconductor material by subjecting the material to ion bombardment so as to release impurity atoms from substitutional sites within the lattice, and heat treating the material to cause the impurity atoms to precipitate in the form of an electrically insulating layer in the regions where they were released from their substitutional sites.

7 Claims, 6 Drawing Figures

FORMATION OF ELECTRICALLY INSULATING LAYERS IN SEMI-CONDUCTING MATERIALS

Figure 1:
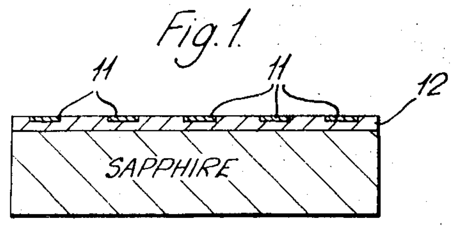

The invention relates to the formation of electrically insulating layers in semiconducting materials.

A problem in the manufacture of semiconductor devices is the isolation of transistors, etc., from the substrate semiconductor in, for example, the manufacture of microelectronic devices.

One solution to this problem is to use a base substrate of high resistivity or insulating material such as, for example, sapphire, and to form a thin surface layer of the semiconductor material, for example appropriately doped silicon, grown epitaxially onto the base substrate.

Another, more common, solution to the problem of isolation has been to use epitaxial silicon deposited on silicon of the opposite conductivity type, and to achieve electrical isolation by the depletion layer of a reverse biassed p-n junction. This method is somewhat expensive, cannot be defined in area, and is very expensive in other semiconductors. There are some materials in which it may be quite impracticable, e.g. in II-VI compounds, which in most cases do not form both conductivity types.

According to the present invention, there is provided a method of manufacturing a semiconducting material with an electrically insulating layer therein, comprising the operations of forming the semiconducting material with impurity atoms occupying substitutional sites in the crystal lattice of the semiconductor, the impurity atoms being such as are capable if released from their substitutional sites of forming an electrically insulating material, subjecting the semiconductor material to bombardment with ions, the ion type and energy being selected so as to create at the desired location for the said insulating layer a region of radiation damage in the semiconductor material and to release impurity atoms from their substitutional sites, and heat treating the semiconductor material so that the released impurity atoms precipitate in the form of the electrically insulating material in the region of radiation damage.

Preferably, the ions used for the bombardment comprise light ions, such as protons, helium ions, or possibly carbon ions, and preferably the semiconductor material is additionally subjected to electron irradiation, either simultaneously with, or subsequently to, the ion bombardment.

The method is particularly suitable for forming a buried insulating layer in a silicon semiconductor. In this case, conveniently the impurity atoms comprise carbon atoms. During the heat treatment the carbon atoms precipitate in the form of silicon carbide concentrated in the region of radiation damage. Thus an electrically insulating layer of silicon carbide can be formed in a silicon semiconductor substrate at a distance below the surface determined by the energy of the bombarding ions.

The invention includes a semiconducting material made by the aforesaid method. Specifically, such a semiconducting material would comprise a semiconducting substrate material formed with impurity atoms therein and a layer, buried within the crystal structure, of electrically insulating material comprising a precipitate of the impurity.

Figure 6:
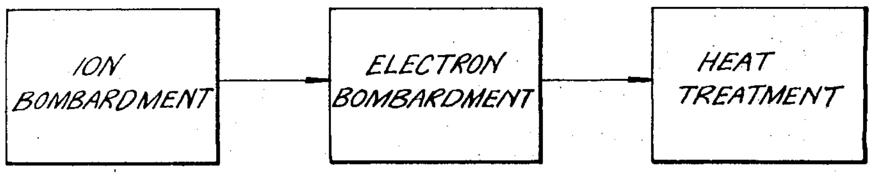

A specific method and semiconducting material embodying the invention will now be described by way of example and with reference to the accompanying drawings in which:

FIG. 1 is a diagrammatic cross-sectional representation of a known arrangement for providing isolation between a plurality of devices on a single chip, FIGS. 2 to 5 are diagrammatic cross-sectional representations of a substrate of semiconducting material at various stages in the example of method embodying the present invention, and FIG. 6 represents schematically the method steps involved.

FIG. 1 shows diagrammatically a plurality of devices 11 which involve, for example, formation of n-type regions in a layer 12 of p-type silicon. It would be most convenient if this layer of p-type silicon could be provided by a self-supporting substrate block of the p-type silicon. However, with such an arrangement, the several devices 11 would not be adequately electrically isolated from one another because of the conductivity of the p-type silicon.

The solution indicated in FIG. 1 is that of growing a thin layer of the p-type silicon 12 epitaxially upon an electrically insulating sapphire substrate.

FIGS. 2 to 6 illustrate the method and structure of the example embodying the present invention. In this example, a block 13 of silicon, appropriately doped for the desired device application — say p-type, is manufactured in such a way that it contains a comparatively high concentration of impurity carbon atoms occupying substitutional sites within the crystal lattice. The carbon concentration should be of the order of, or somewhat greater than, $10^{19}$ atoms per cc. It is also important that the oxygen content should be low. That is, the material should desirably be float-zoned material. This is because carbon interstitials released by irradiation tend to form a complex with oxygen. This would impede migration of carbon interstitials to the radiation damaged region (see following description, in particular that referring to FIG. 4).

The block 13 is then subject to bombardment by a beam of protons as indicated by the arrows 14. The protons create radiation damage in the substrate block 13 and this is concentrated at the ends of the proton paths within the block. There is thus formed a layer of radiation damage below the surface of the block 13. This layer is indicated at 15.

The proton irradiation will also release certain of the carbon impurity atoms from their substitutional sites within the silicon block 13. The released impurity carbon atoms are indicated by the dots 16 in the drawings.

It will be appreciated that the depth at which the layer 15 is formed will depend upon the energy of the protons. Because the protons are light ions, the energy required to produce a layer 15 at a depth satisfactory for device application is not very high and may be, for example, of the order of 100–500 KeV. It will also be appreciated that other light ions may be employed for the bombardment. For example, one may use helium ions or possibly carbon ions, or it might even be satisfactory to use oxygen ions. However, the heavier the ion, the more the radiation damage caused between the surface and the end of the ions' path. Also, for heavier ions, a higher energy is required to secure the same depth of penetration. It should be noted that, where carbon ions are employed for the bombardment, their significant action is to create the damage to which impurity carbon atoms released from substitutional sites within the lattice may migrate. Although bombardment with carbon ions will, of itself, provide additional carbon atoms for precipitation at the damaged region, this contribution of the bombarding ions is insignificant, a very large implantation dose being necessary before any significant concentration of carbon atoms could be built up.

Figures 2, 3, 4, 5:
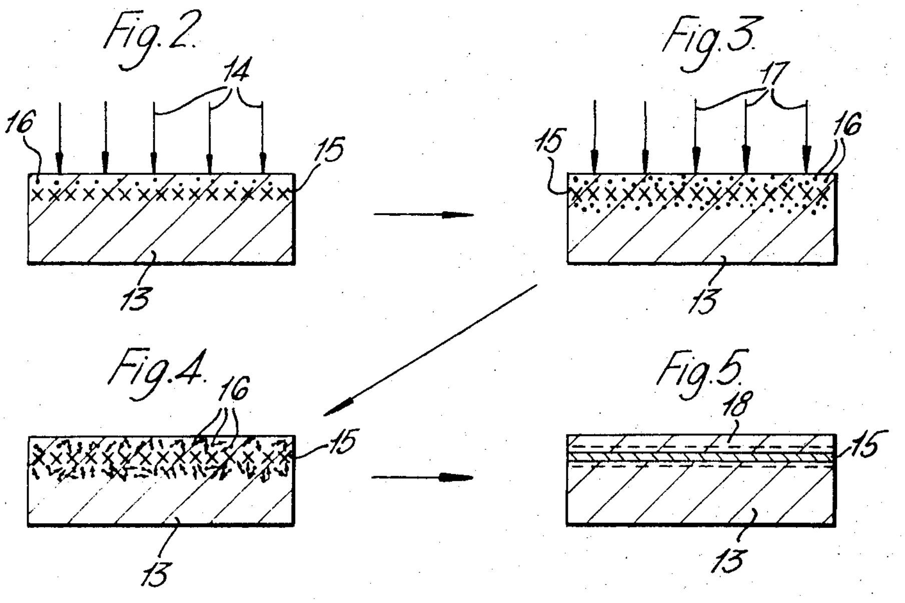

After a satisfactory layer 15 of radiation damage has been achieved by the proton irradiation, the block 13 is subjected to irradiation with low energy electrons as indicated by arrows 17 in FIG. 3. The significance of this step is that the difference in atomic mass of the impurity carbon and the silicon permits selection of the electron beam energy such that carbon impurity atoms are released from their substitutional sites in the lattice but little radiation damage to the silicon lattice structure is effected. Thus, a larger number of carbon atoms can be made available for subsequent precipitation in the damaged region without unduly extending the desired width of the damaged layer.

The treated block 13 is then annealed. It is believed an annealing temperature of around 800°–1,000°C will be appropriate, although a somewhat higher temperature may be necessary for securing adequate formation of a silicon carbide precipitate.

The annealing step is illustrated by FIG. 4, in which carbon atoms 16 released by the irradiation steps illustrated in FIGS. 2 and 3 will migrate and eventually precipitate in the region of the radiation damaged layer 15. The migration of the carbon atoms is illustrated diagrammatically by the arrows.

FIG. 5 illustrates the resultant structure in which carbon atoms have precipitated in a silicon carbide rich phase of low conductivity in a layer corresponding to the layer 15 of radiation damage. The existence of a phase boundary also introduces considerable electron and hole scattering so that conductivity across the boundary is further reduced.

In this way, a layer 18 (FIG. 5) of p-type silicon is formed in, but isolated from, the substrate block 13 under clean high-vacuum conditions throughout the whole manufacturing operation. The need for vapour (or liquid) phase epitaxy is avoided and, furthermore, by providing masking during the ion irradiation steps, the layer can be formed in a predetermined pattern.

The invention is not restricted to the details of the foregoing example. For instance, the electron bombardment need not necessarily be carried out as a separate step but may be carried out simultaneously with the ion bombardment. The technique may be applied to other semiconductor materials, for example germanium or gallium arsenide. In that case, however, success of the technique would depend upon selection of a satisfactory impurity. The precise temperature range for the annealing step will have to be chosen according to the particular nature of the semiconducting material. In general, the temperature adopted will be the minimum necessary to allow the displaced impurity atoms to precipitate out and to anneal the radiation damage.

We claim:

1. A method of manufacturing a semiconducting material with an electrically insulating layer therein, which method comprises incorporating impurity atoms in the semiconducting material during the crystal growth thereof, whereby the impurity atoms occupy substitutional sites in the crystal lattice of the semiconductor, the said impurity comprising an element selected from the group consisting of elements, which, when released from the substitutional sites, is electrically insulating or combines with the semiconductor to form an electrically insulating material, subjecting the grown crystal of semiconductor material to bombardment with ions, the ion type and energy being selected so as to create at the desired location for the said insulating layer a region of radiation damage in the semiconductor material and to release impurity atoms from their substitutional sites, and heat treating the semiconductor material so that the released impurity atoms precipitate in the form of the electrically insulating material in the region of radiation damage.

2. A method according to claim 1 wherein the ions are selected from the group consisting of protons, helium ions and carbon ions.

3. A method according to claim 1 including the operation of subjecting the semiconductor material to electron irradiation simultaneously with the ion bombardment.

4. A method according to claim 1 including the operation of subjecting the semiconductor material to electron irradiation subsequently to the ion bombardment and before heat treatment.

5. A method of manufacturing a body of silicon having an insulating layer buried within the body comprising the operations of incorporating carbon atoms in a region of the body of silicon during crystal growth thereof whereby the carbon atoms occupy substitutional sites in the crystal lattice of the silicon, bombarding the body with protons so as to release a proportion of the carbon atoms from their substitutional sites in the crystal lattice, and heating the body to a temperature sufficient to cause carbon atoms to leave the sustitutional sites and precipitate to form a region of silicon carbide of low conductivity within the body.

6. A semiconducting material comprising a body of semiconductor material having impurity atoms occupying substitutional sites distributed throughout the crystal lattice and, buried within the crystal lattice of the body, a layer of insulating material consisting of a precipitate of the impurity material.

7 A semiconducting material comprising a body of semiconductor material having impurity atoms occupying substitutional sites in the crystal lattice and, buried within the crystal lattice of the body, a layer of insulating material consisting of a precipitate of the impurity material, said semiconducting material having been produced by the method claimed in claim 1.

* * * * *